United States Patent [19]
Saitoh

[11] Patent Number: 6,060,739
[45] Date of Patent: May 9, 2000

[54] NON-VOLATILE SEMICONDUCTOR MEMORY DEVICE HAVING A FLOATING GATE INSIDE A GROVE

[75] Inventor: Kenji Saitoh, Tokyo, Japan

[73] Assignee: NEC Corporation, Tokyo, Japan

[21] Appl. No.: 08/935,538

[22] Filed: Sep. 23, 1997

[51] Int. Cl.[7] .................................................. H01L 29/76
[52] U.S. Cl. ...................... 257/314; 257/240; 257/239; 257/244; 257/284; 257/330; 257/315; 257/332
[58] Field of Search ................................. 257/240, 239, 257/244, 284, 330, 332, 315, 314

[56] References Cited

U.S. PATENT DOCUMENTS

| | | |
|---|---|---|
| 5,146,426 | 9/1992 | Mukherjee et al. . |
| 5,508,545 | 4/1996 | Uchiyama .............................. 257/330 |
| 5,574,302 | 11/1996 | Wen et al. ............................... 257/330 |

FOREIGN PATENT DOCUMENTS

| | | |
|---|---|---|
| 55-34432 | 3/1980 | Japan . |
| 4-12573 | 1/1992 | Japan . |
| 4-267374 | 9/1992 | Japan . |
| 5-326970 | 12/1993 | Japan . |
| 8-326970 | 12/1996 | Japan . |

*Primary Examiner*—Fetsum Abraham
*Attorney, Agent, or Firm*—Foley & Lardner

[57] ABSTRACT

A semiconductor well region has a groove into which a block-shaped floating gate is formed. The block-shaped floating gate has a bottom surface facing a bottom surface of the semiconductor well region served as a first channel region, a first side surface facing one of side surfaces of the semiconductor well region served as a second channel region, a second side surface facing the other of side surfaces of the semiconductor well region served as a third channel region, thereby a channel width is trebled.

8 Claims, 12 Drawing Sheets

NON-VOLATILE SEMICONDUCTOR MEMORY DEVICE HAVING A FLOATING GATE INSIDE A GROVE

BACKGROUND OF THE INVENTION

A present invention relates to a non-volatile semiconductor memory device, and more particularly to a non-volatile semiconductor memory device which is electrically flasherasable.

An EEPROM flush memory which is inexpensive and flasherasable has been well known as one kind of EEPROMs. Many flash memories have been developed, and one of them is disclosed in "IEDM 91 Technical Digest", 11. 5. 1 (p311 to p314).

The structure of such conventional EEPROM flash memory will be described using FIGS. 10–14. FIGS. 11–14 are sectional views of a memory cell section taken along the line A–A' of FIG.10.

First, as shown in FIG. 11, a first silicon oxide film 14, a first polycrystalline silicon film 15 and an ONO film 18 are sequentially formed on a P type silicon substrate 11.

Next, as shown in FIG.12, the ONO film 18 and the first polycrystalline film 15 are sequentially removed in a stripe shape and the remaining films 18 and 15 extend in a column direction.

Subsequently, as shown in FIG. 13, arsenic ions are implanted into the P type silicon substrate 11 using the first polycrystalline silicon films 15 and the ONO films 18 as masks, whereby N type diffusion layers constituting buried diffusion layers 16 serving as bit lines are formed. Next, a second silicon oxide film 13 is formed by a CVD method, the second film oxide film 13 has such a thickness that intervals between the first polycrystalline silicon films 15 are completely buried. Subsequently, an anisotropic etching is performed for removing the quantity of a thickness equivalent to that of the second silicon oxide film 13, thereby obtaining the structure shown in FIG.13.

Next, as shown in FIG. 14, a second polycrystalline silicon film 17 serving as a control gate of the memory cell is formed. After a lithography step, the second polycrystalline silicon film 17 is etched to stripe, specifically, separate pieces of the film 17 form the stripe in the row direction. Moreover, the ONO film 18 and the first polycrystalline silicon film 15 are sequentially etched, whereby the conventional EEPROM flash memory is completed.

However, in the conventional EEPROM flash memory, as micronization of the memory cell is advanced, a width of the channel region is narrowed so that a desired ON current of the memory cell will not able to be secured. Particularly, when the conventional EEPROM flash memory is applied to a multi-value memory in which more than four values (00, 01, 10, 11) is stored in each memory cell, large ON current of the memory cell of such memory than that of a two-value (0, 1) memory is required. For this reason, there has been a problem that it will be more difficult to realize a memory cell of much values as the micronization thereof advances.

Furthermore, since a height of the memory cell region is taller than those that of peripheral region in which a decoder circuit, a buffer circuit and the like are formed, the step difference between the memory cell region and the peripheral region are large, so that problems in the fabricating process such as photo lithography process arise.

Furthermore, as disclosed in Japanese Patent Application Laid Open No. hei 7-45797, there has been a way in which a groove is formed on a semiconductor substrate and a channel of a memory cell is formed on the side surface of the groove.

However, in the art disclosed in the Japanese Patent Application Laid Open No. hei 7-45797, although a degree of integration is advanced because the side surface of the groove is used as the channel of the memory cell transistor, it has been difficult to increase the ON current.

SUMMARY OF THE INVENTION

It is therefore an object of the present invention to provide an improved non-volatile semiconductor memory device.

It is another object of the present invention to provide a non-volatile semiconductor memory device capable of effectively increasing an ON current.

It is still another object of the present invention to provide a non-volatile semiconductor memory device in which a plurality of memory cells, a channel width of which has wide, are employed without deteriorating the degree of the integration.

A non-volatile semiconductor memory device according to the present invention comprises a semiconductor well region of a first conductivity type having a groove, said semiconductor well region having a bottom surface which defines a bottom of said groove, a first side surface which defines one side of said groove, and a second side surface which defines the other side of said groove, said groove having a first, a second and a third area, said third area of said groove being interposed between said first and second areas of said groove; a floating gate electrode formed into said third area of said groove, said floating gate electrode having a top surface, a bottom surface, a first side surface, and a second side surface; a first dielectric film intervening between said bottom surface of said semiconductor well region at said third area of said groove and said bottom surface of said floating gate electrode; a second dielectric film intervening between said first side surface of said semiconductor well region at said third area of said groove and said first side surface of said floating gate electrode; a third dielectric film intervening between said second side surface of said semiconductor well region at said third area of said groove and said second side surface of said floating gate electrode; a fourth dielectric film formed on said top surface of said floating gate electrode; a first diffusion region of a second conductivity type formed in said bottom, first and second side surfaces of said semiconductor well region at said first area of said groove; a second diffusion region of said second conductivity type formed in said bottom, first and second side surfaces of said semiconductor well region at said second area of said groove; and a control gate electrode formed on said fourth dielectric film, each of said bottom, first and second side surfaces of said semiconductor well region at said third area of said groove being served as a channel region. dr

BRIEF DESCRIPTION OF THE DRAWINGS

The above and other objects, features and advantages of the present invention will be apparent from the following description taken in conjunction with the accompanying drawings, in which.

DETAILED DESCRIPTION OF THE PREFERRED EMBODIMENTS

An embodiment of the present invention will be described with reference to the accompanying drawings.

Figure 7:
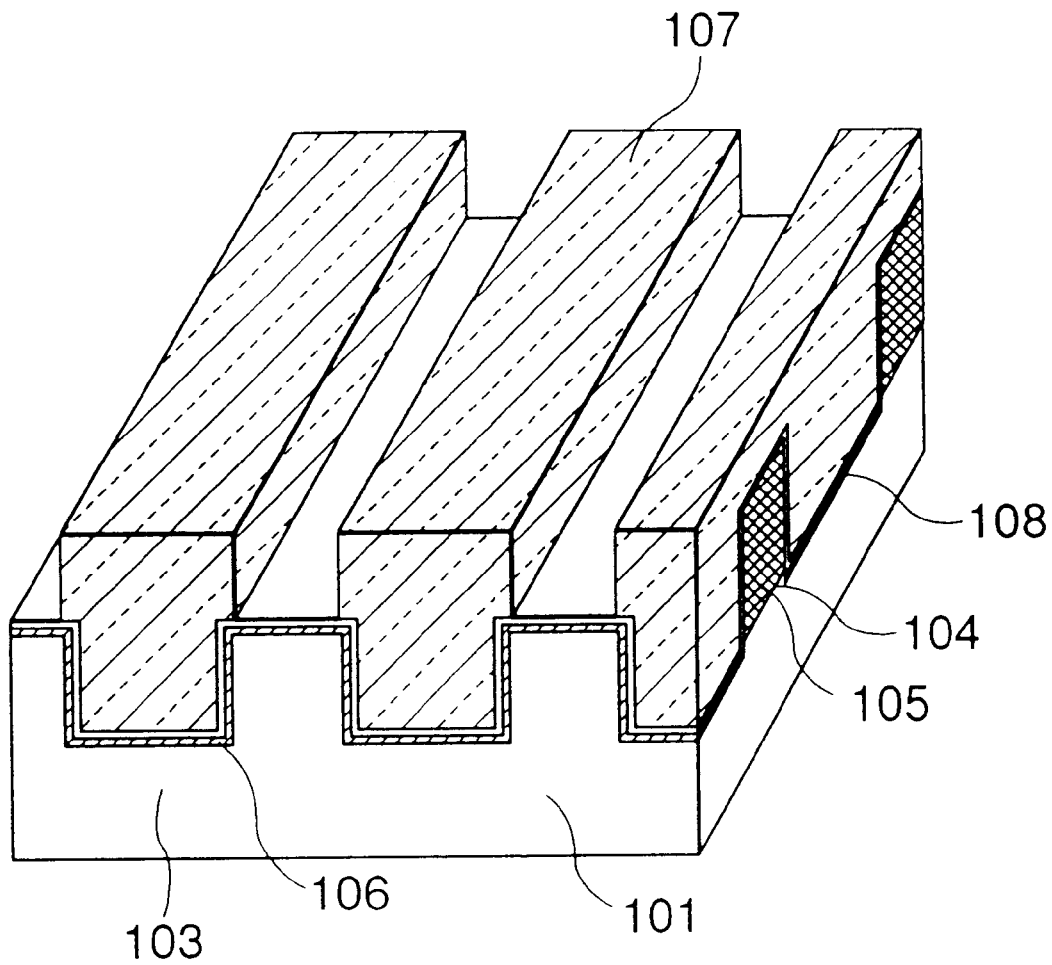

The structure of a non-volatile semiconductor memory device of first embodiment is shown in FIG. 7. The non-volatile semiconductor memory device of this embodiment includes a stripe-shaped groove formed in a P type well region 101 and a block-shaped floating gate buried in the groove. The P type well region 101 facing the bottom surface and two side surfaces (right and left surface) of the block-shaped floating gate is used as a channel region of single memory cell transistor of the memory device.

Next, manufacturing steps of the non-volatile semiconductor memory device show n in FIG. 7 will be described using FIGS. 1–6.

Figure 1:
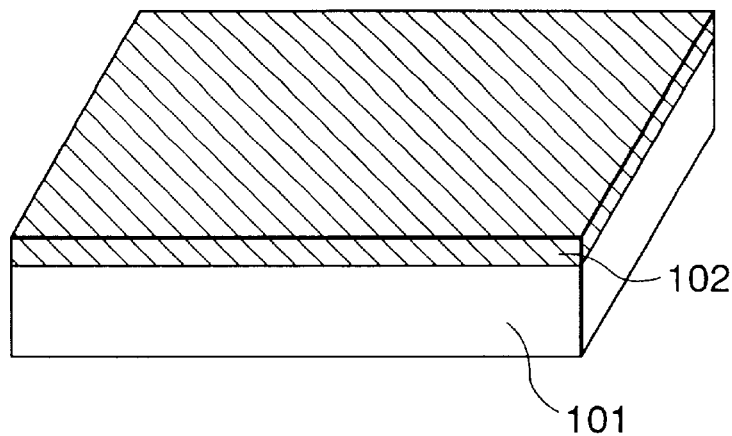
FIGS. 1–7 are schematic diagrams successively showing the fabricating steps of the non-volatile semiconductor memory device according to a first embodiment.

First, as shown in FIG. 1, a first silicon oxide film 102 is formed on the P type well region 101. A film thickness of the first silicon oxide film 102 should be preferably 0.1 $\mu$m. It should be noted that the P type well region 101 is formed in a P type silicon substrate and is isolated from other regions by a field oxide film (not shown).

Figure 2:
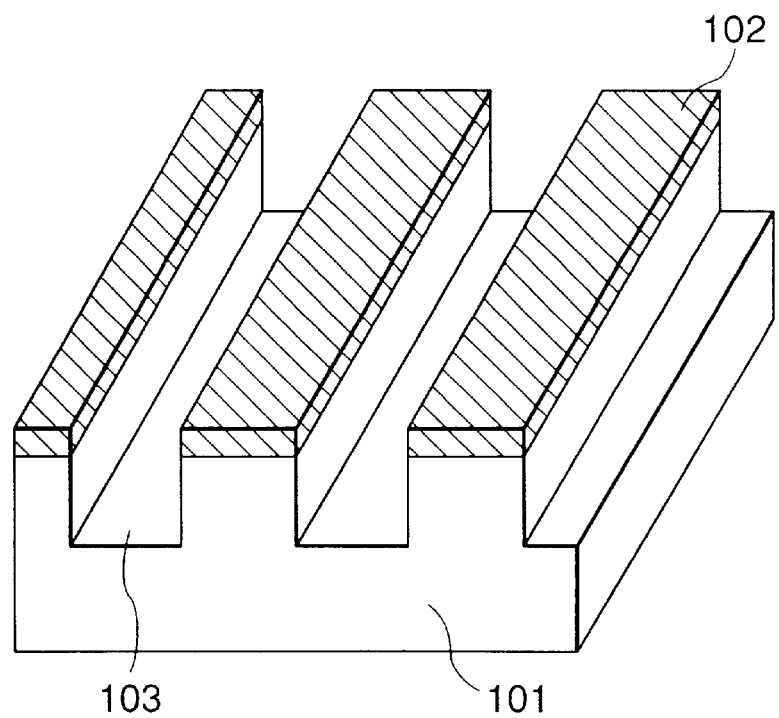

Next, as shown in FIG. 2, the first silicon oxide film 102 and the P type well region 101 are sequentially etched by means of an anisotropic dry etching technique such as reactive ion etching (RIE), whereby stripe-shaped grooves 103 are formed. A depth of the grooves 103 should be preferably 0.3 to 0.5 $\mu$m, more preferably 0.4 $\mu$m.

Figure 3:
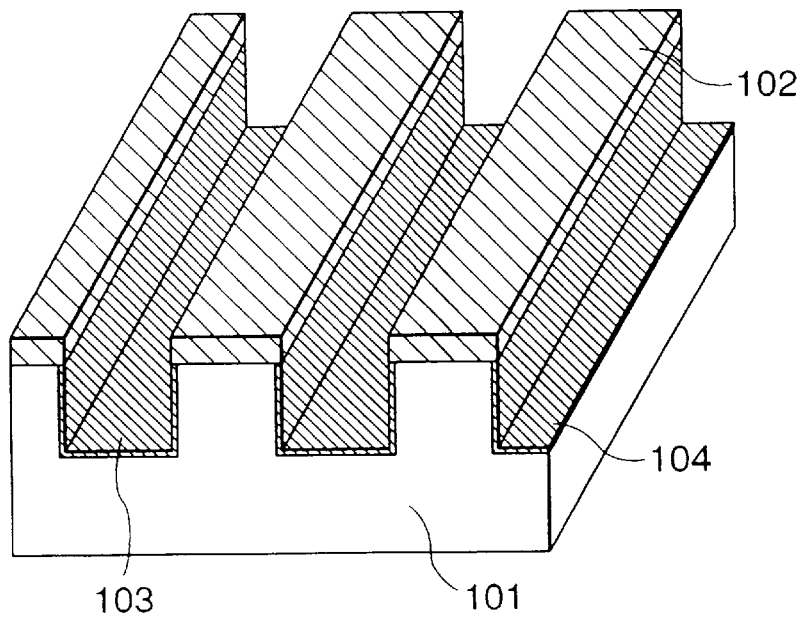
Figure 4:
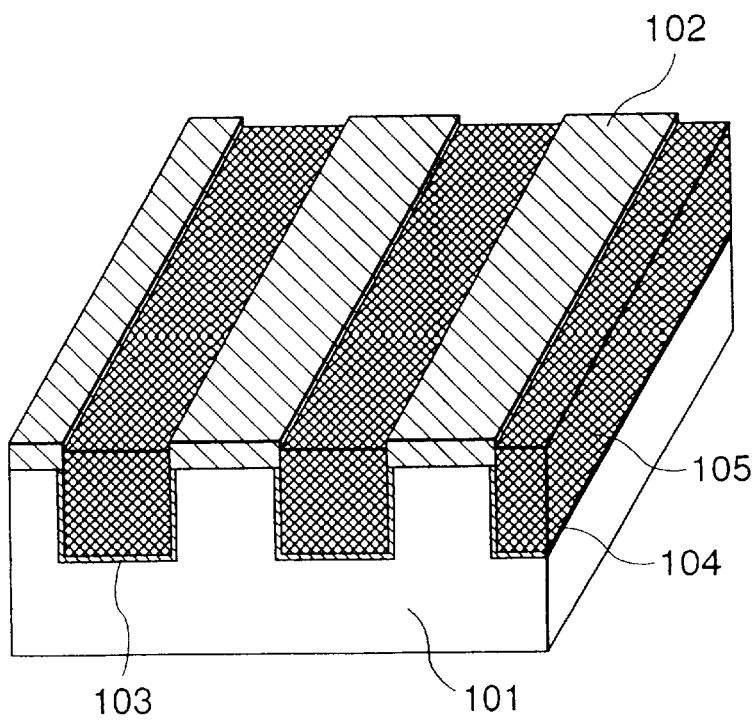

Next, as shown in FIG. 3, a second silicon oxide film 104 is formed by a thermal oxidation technique. A film thickness of the second silicon oxide film 104 should be preferably 0.01 $\mu$m. Subsequently, a first polycrystalline silicon film 105 is formed on the entire surface of the resultant structure by a low pressure CVD method. A film thickness of the first polycrystalline silicon film 105 must be equal to half of the width of the groove 103 or more. Specifically, by forming the first polycrystalline silicon film 105 having the film thickness more than half of the width of the groove 103, the groove 103 is completely filled with the first polycrystalline silicon film 105.

Subsequently, the first polycrystalline silicon film 105 formed on the entire surface is subjected to an anisotropic dry etching such as RIE to expose the surface of the first silicon oxide film 102. Thus, the structure shown in FIG. 4 can be obtained.

Figure 5:
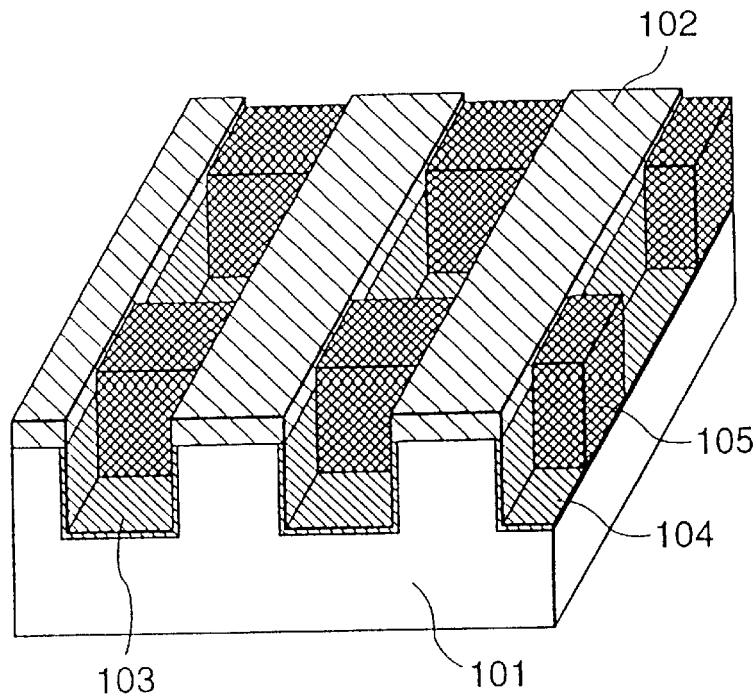

Next, using a photolithography step, stripe-shaped photoresists (not shown) are formed on the surface of the first polycrystalline silicon film 105 and the exposed first silicon oxide film 102, the photoresist being in a direction perpendicular to the groove 103. The polycrystalline silicon film 105 is then subjected to an anisotropic dry etching such as RIE using the photoresist of such stripe-shaped as a mask to expose the second silicon oxide film 104 formed on the bottom surface of the groove 103 and forming the block-shaped first polycrystalline silicon film 105. Thus, the structure shown in FIG. 5 is obtained.

Next, while remaining the foregoing photoresist, the first and second silicon oxide films 102 and 104 are subjected to an anisotropic etching such as RIE, whereby the P type well region 101 between the grooves 103 (i.e., a top surface of the P type well region 101) is exposed. Since the thickness of the first silicon oxide film 102 is thicker than that of the second silicon oxide film 104, the silicon oxide film 104 formed on the bottom surface of the groove 103 is completely removed, whereby the bottom surface of the groove 103 is exposed. Although the second silicon oxide film 104 formed on the side surface of the groove 103 is not apt to be perfectly removed because of the anisotropic etching, there are no problems. Thus, the structure that a top surface of the first silicon oxide film 102 and the block-shaped first polycrystalline silicon film 105 are covered with the photoresist but the bottom and top surfaces of the P type well region 101 are exposed is obtained.

Figure 6:
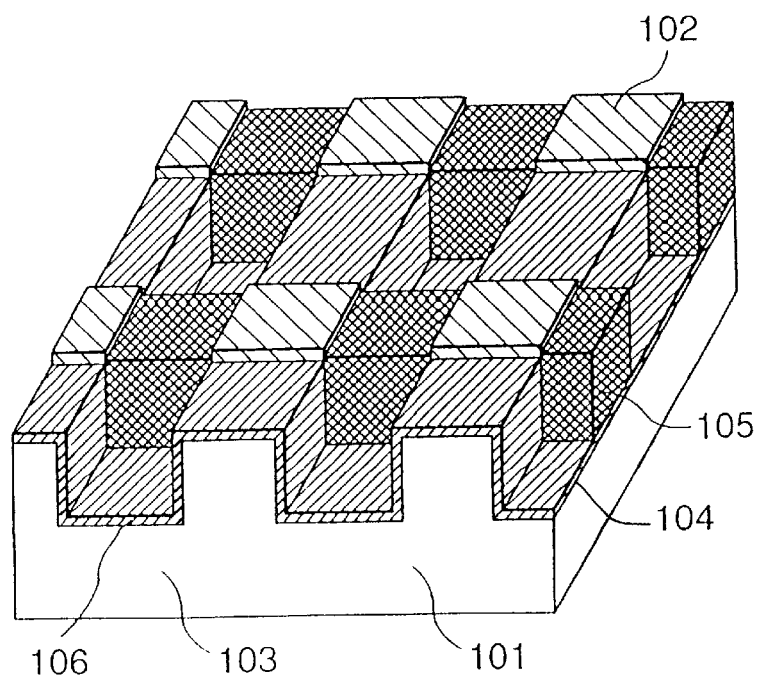

Thereafter, N type impurities, for example, arsenic are ion-implanted into the P type well region 101 between the grooves 103 (top surface) and the bottom surface and side surface of the groove 103, whereby a diffusion layer 106 is formed. After the ion implantation is performed, the photoresist covering the top surface of the first silicon oxide film 102 and the block-shaped first polycrystalline silicon film 105 is removed. Thus, the structure shown in FIG.6 is obtained. Such ion-implantation is conducted from a slant direction to the substrate as well as a perpendicular direction thereto so that arsenic ions are implanted also into the side surface of the groove 103. Energy for the implantation of arsenic ions are 40 KeV and the dose amount thereof is $5 \times 10^{15}$ cm$^2$, although the conditions are not especially limited.

Subsequently, a third silicon oxide film 108 is formed on the top and side surfaces of the first polycrystalline silicon film 105 and the surfaces of the diffusion layer 106, by means of a thermal oxidation. Thereafter, a second polycrystalline silicon film 107 is formed so as to completely fill the groove 103. Subsequently, the second polycrystalline silicon film 107 is subjected to an anisotropic etching such as RIE along the groove 103, whereby the third silicon film 108 formed between the grooves 103 is exposed. Thus, the structure shown in FIG. 7 is obtained.

Thereafter, an interlayer insulating film is formed on the entire surface of the resultant structure. The diffusion layer 106 serving as a bit line is connected to a metal wiring (not shown) formed in parallel with the diffusion layer 106. Thus, the non-volatile semiconductor device of this embodiment of the present invention is completed.

In the non-volatile semiconductor device of this embodiment, the second polycrystalline silicon film 107 serves as a control gate; the first polycrystalline silicon film 105, a floating gate; the diffusion layer 106, a source/drain region; and the P type well region 101 facing the first polycrystalline silicon layer 105, a channel region.

In an actual writing operation, a voltage of 12V is applied to the second polycrystalline silicon film 107 (control gate= word line); 7V, the diffusion layer 106 serving as a drain (bit line); and 0V, the diffusion layer 106 serving as a source (source line), whereby channel hot electrons generated near the drain are injected to the first polycrystalline silicon film 105 (floating gate). On the other hand, an erasing operation is conducted in such manner that electrons are drawn out from the floating gate to the bit lines by applying a voltage of –16V to the control gate (word line) and a voltage of 5V to all of the bit lines.

Figure 8:
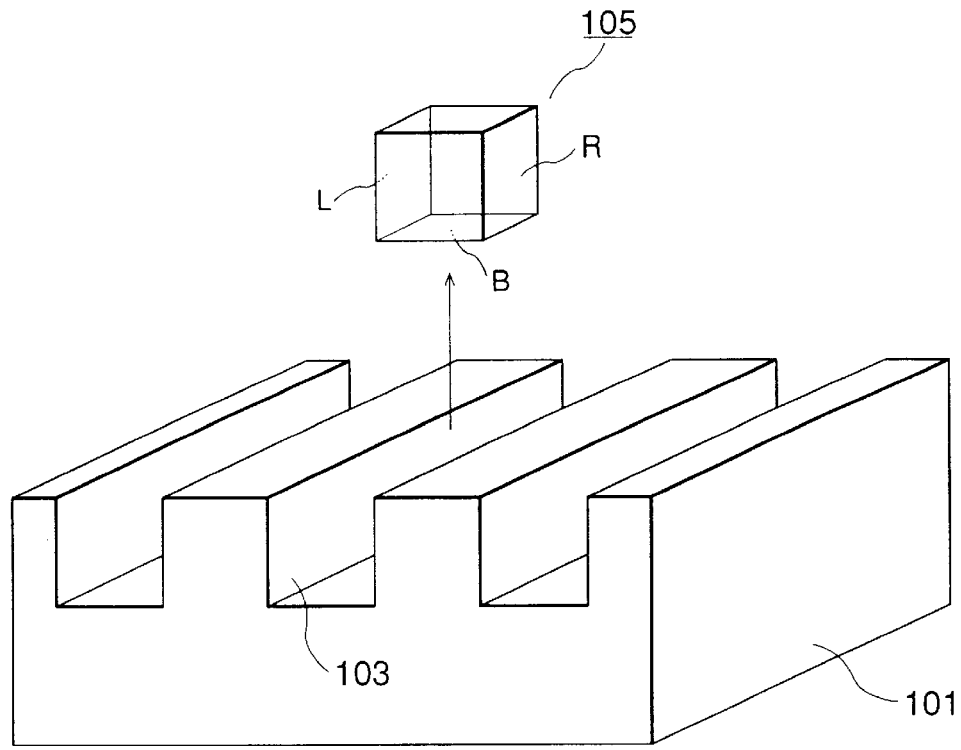
FIGS. 8 and 9 is schematic diagrams to facilitate an understanding of the non-volatile semiconductor memory device according to the first embodiment of the present invention.
Figure 9:
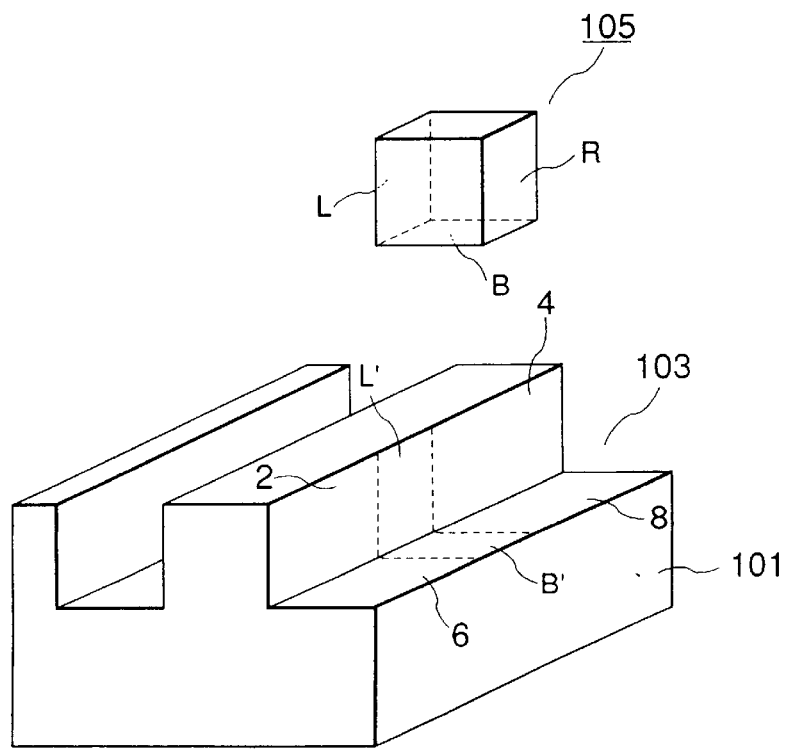
Figure 10:
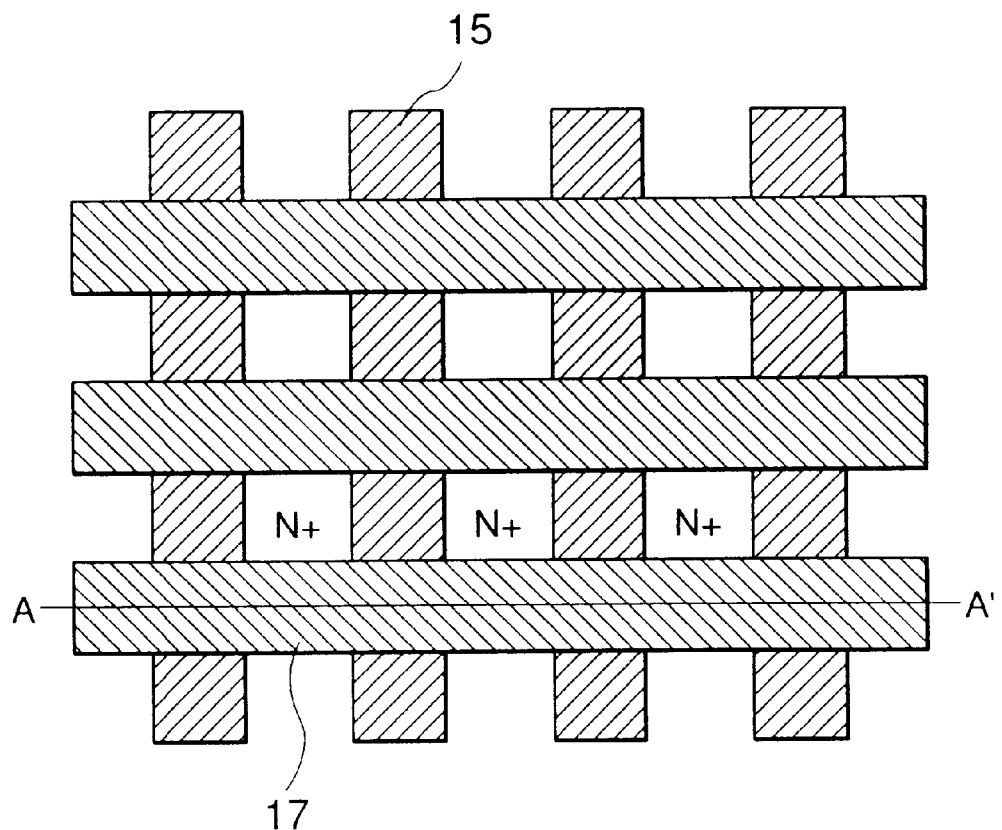
FIG. 10 is a schematic diagram showing a plan view of the conventional non-volatile semiconductor memory device.
Figure 11:
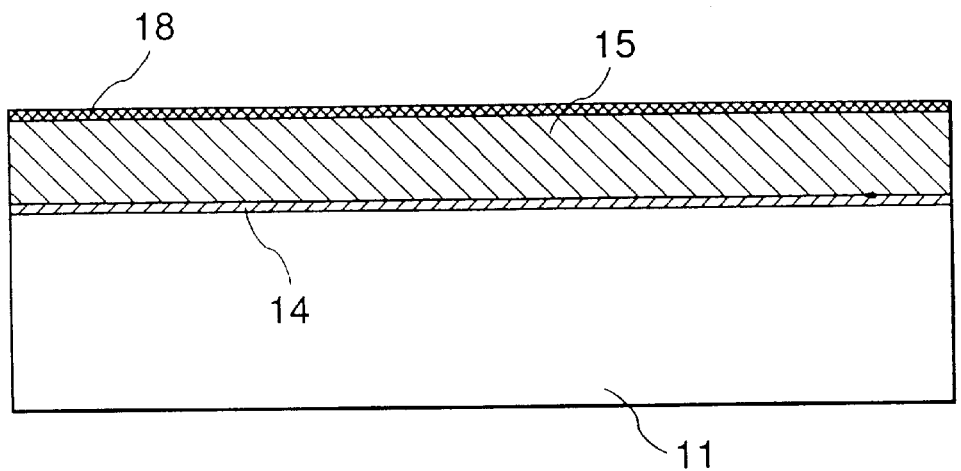
FIGS. 11–14 are schematic diagrams successively showing the fabricating steps of the conventional non-volatile semiconductor memory device.
Figure 12:
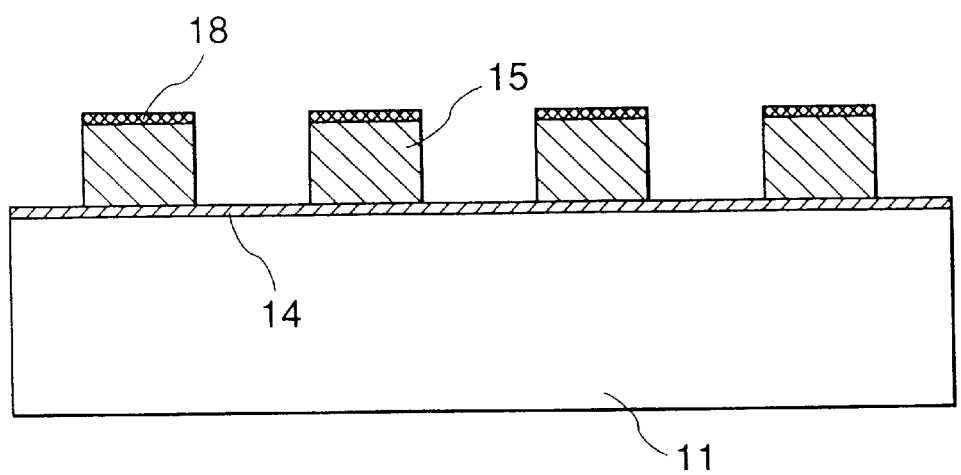
Figure 13:
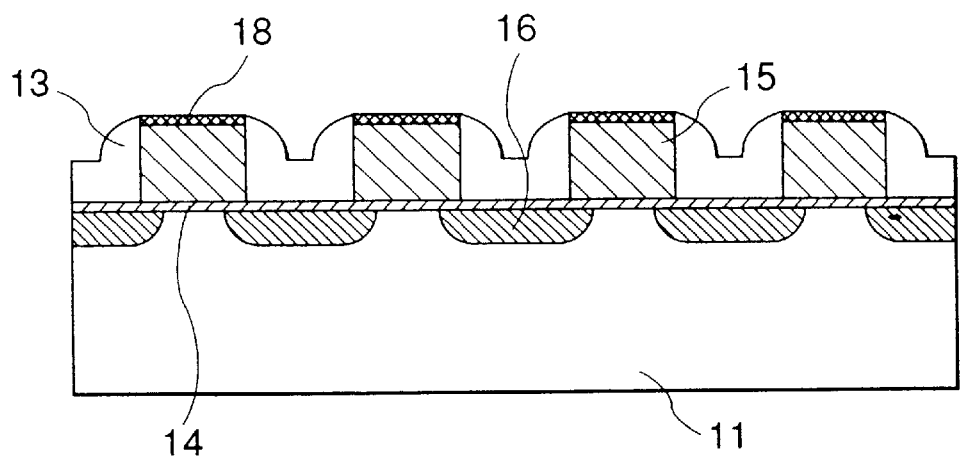
Figure 14:
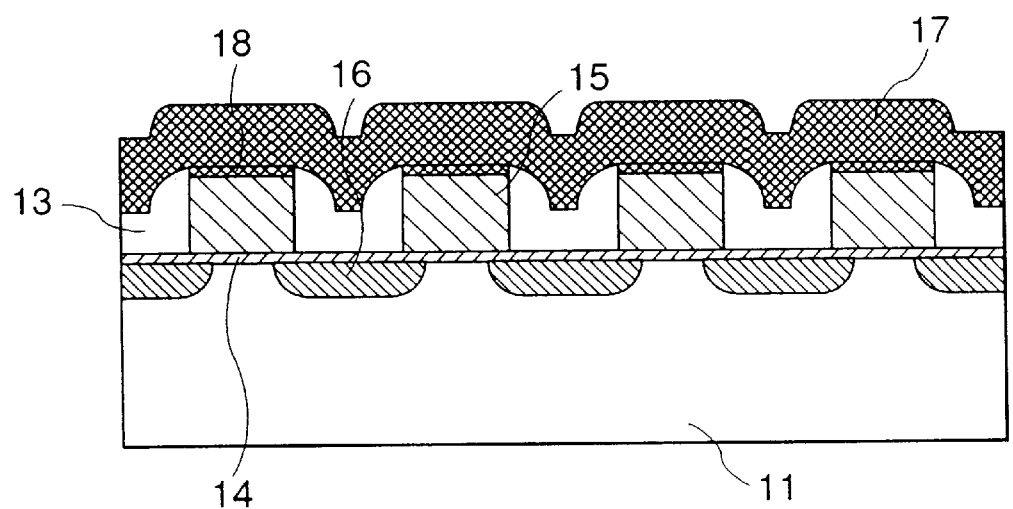

Here, to facilitate the understanding the advantages of the aforementioned non-volatile semiconductor device of the embodiment, the non-volatile semiconductor device of the embodiment will be further described using FIGS. 8 and 9.

FIG. 8 is a drawing showing the block-shaped first polycrystalline silicon film 105 pulled out from the groove 103, the first polycrystalline silicon film 105 is inherently buried in the groove 103. It is defined that the bottom surface of the pulled-out first polycrystalline silicon film 105 is B, the side surface on the right is R, and the side surface on the left is L. Specifically, it can be understood that the bottom surface B, the right side surface R and the left side surface L, among the six surfaces of the block-shaped first polycrystalline silicon film 105, face the P type well region 101 in the groove 103.

FIG. 9 is a drawing in which the right side surface of the groove 103 burying the first polycrystalline silicon film 105 is omitted, and FIG. 9 is the drawing for the sake of easiness to look into the inside of the groove 103. In the drawing, reference symbol B' denotes a surface to which the bottom surface B of the buried first polycrystalline silicon film 105 inherently faces, and reference symbol L' denotes a surface to which the left side surface L' of the buried first polycrystalline silicon film 105 inherently faces. It is a matter of course that a surface R' to which the right side surface of the first polycrystalline silicon film 105 inherently faces exists.

As is understood from FIGS. 8 and 9, the block-shaped first polycrystalline silicon film 105 serving as the floating gate has the bottom surface B, the right side surface R and the left side surface L facing the P type well region 101 in the groove 103, and the surfaces B', L' and R' facing these three surfaces, respectively, serve as channel regions. For example, as to the left side surface L of the first polycrystalline silicon film 105, the regions 2 and 4 in the left side surface of the groove 103 function as the source/drain regions, and the region L' function as the channel region. Similarly, as to the bottom surface B of the first polycrystalline silicon film 105, the regions 6 and 8 in the bottom surface of the groove 103 function as the source/drain regions, and the region B' functions as the channel region. Also as to the right side surface R of the first polycrystalline silicon film 105, the region R' on the right side surface of the groove 103 (not shown) functions as the channel region.

As described above, according to the non-volatile semiconductor device of this embodiment of the present invention, since one memory cell transistor has three channel regions, an effective value of a channel width will be tripled. Therefore, it will be possible to secure a sufficient ON-current. Thus, a formation of the memory cell operating in a multi-value state can be easily achieved.

In addition, according to the non-volatile semiconductor device of this embodiment of the present invention, since the two channels among three channels uses side surfaces in the groove, an area of a plain region to be required is small, so that a degree of integration can be increased.

Next, a non-volatile semiconductor device of second embodiment of the present invention will be described with reference to FIGS. 15 to 21.

The non-volatile semiconductor device of this embodiment differs from that of the first embodiment in that a depth of the diffusion layer 106 constituting bit lines and the source and drain of the memory cell is deeper than that of the groove 103. According to this embodiment, resistance of sub bit line can be reduced and characteristics of the memory chip can be improved.

A manufacturing method of the non-volatile semiconductor device according to this embodiment will be described in the order of manufacturing steps.

Figure 15:
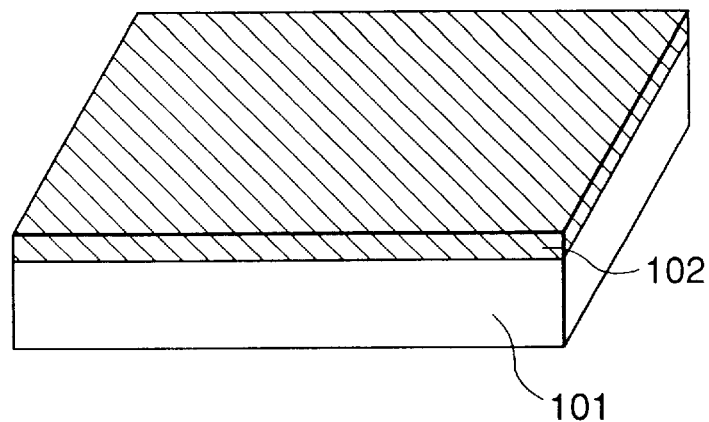
FIGS. 15–21 are schematic diagrams successively showing the fabricating steps of the non-volatile semiconductor memory device according to a second embodiment of the present invention.

First, as shown in FIG. 15, a first silicon oxide film 102 is formed on the P type well region 101. A film thickness of the first silicon oxide film 102 should be preferably 0.1 $\mu$m. It should be noted that the P type well region 101 is formed in a P type silicon substrate and is isolated from other regions by a field oxide film (not shown).

Figure 16:
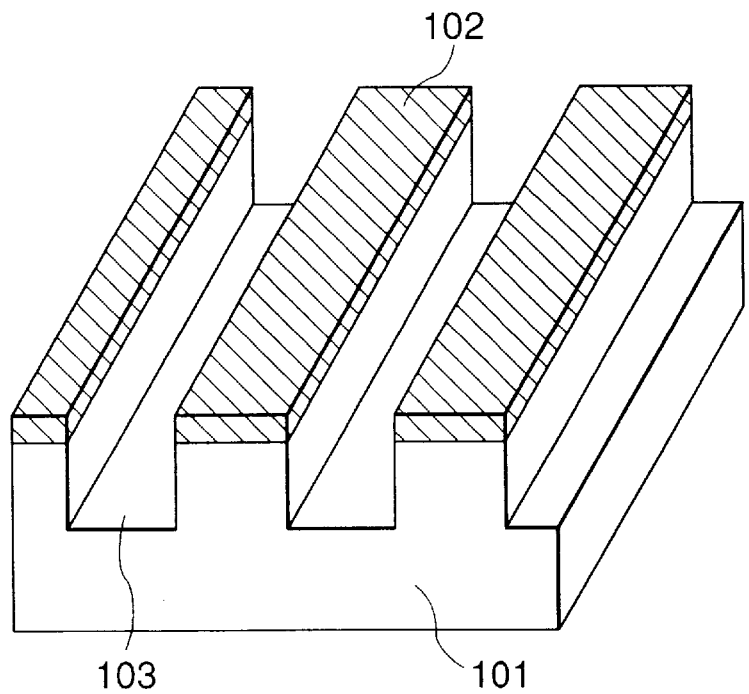

Next, as shown in FIG. 16, the first silicon oxide film 102 and the P type well region 101 are sequentially etched by means of an anisotropic dry etching technique such as reactive ion etching (RIE), whereby stripe-shaped grooves 103 are formed. A depth of the grooves 103 should be preferably 0.3 to 0.5 $\mu$m, more preferably 0.4 $\mu$m.

Figure 17:
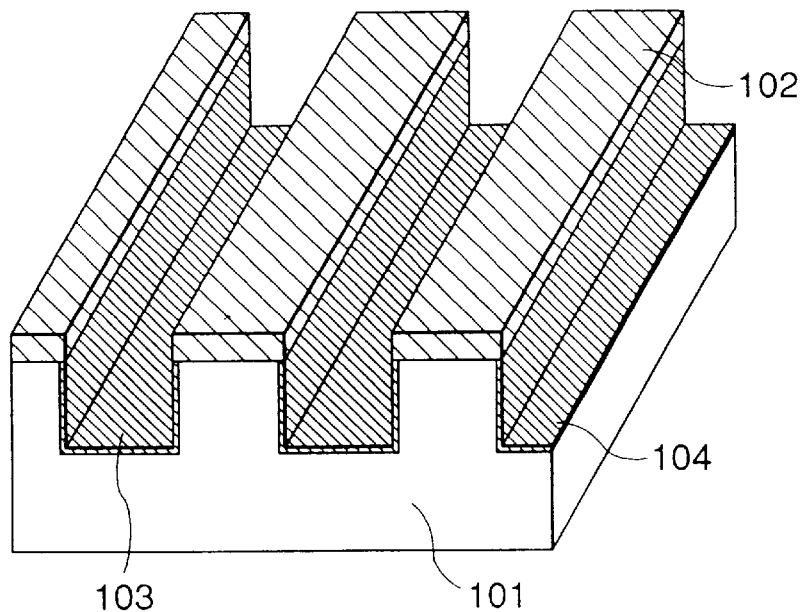
Figure 18:
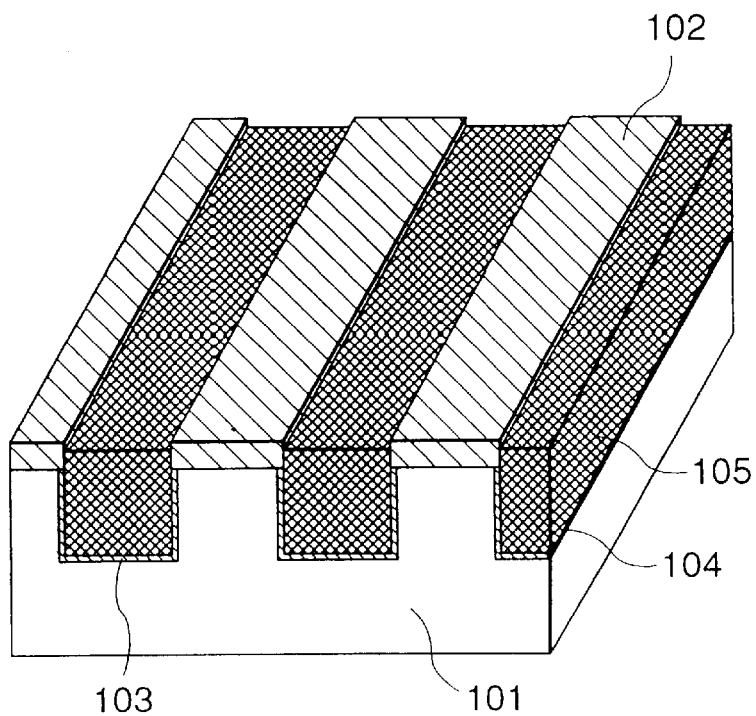

Next, as shown in FIG. 17, a second silicon oxide film 104 is formed by a thermal oxidation technique. A film thickness of the second silicon oxide film 104 should be preferably 0.01 $\mu$m. Subsequently, a first polycrystalline silicon film 105 is formed on the entire surface of the resultant structure by a low pressure CVD method. A film thickness of the first polycrystalline silicon film 105 must be equal to half of the width of the groove 103 or more. Specifically, by forming the first polycrystalline silicon film 105 having the film thickness more than half of the width of the groove 103, the groove 103 is completely filled with the first polycrystalline silicon film 105.

Subsequently, the first polycrystalline silicon film 105 formed on the entire surface is subjected to an anisotropic dry etching such as RIE to expose the surface of the first silicon oxide film 102. Thus, the structure shown in FIG. 18 can be obtained.

Figure 19:
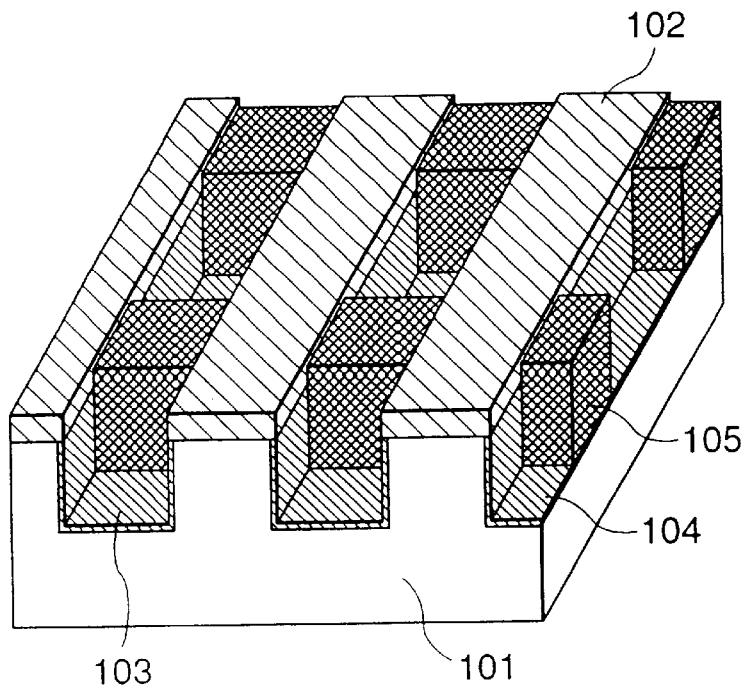

Next, using a photolithography step, stripe-shaped photoresists (not shown) are formed on the surface of the first polycrystalline silicon film 105 and the exposed first silicon oxide film 102, the photoresist being in a direction perpendicular to the groove 103. The first silicon oxide film 102 is then subjected to an anisotropic dry etching such as RIE using the photoresist of such stripe-shaped as a mask to expose the second silicon oxide film 104 formed on the bottom surface of the groove 103 and forming the block-shaped first polycrystalline silicon film 105. Thus, the structure shown in FIG. 19 is obtained.

Next, while remaining the foregoing photoresist, the first and second silicon oxide films 102 and 104 are subjected to an anisotropic etching such as RIE, whereby the P type well region 101 between the grooves 103 (i.e., a top surface of the P type well region 101) is exposed. Since the thickness of the first silicon oxide film 102 is thicker than that of the second silicon oxide film 104, the silicon oxide film 104 formed on the bottom surface of the groove 103 is completely removed, whereby the bottom surface of the groove 103 is exposed. Although the second silicon oxide film 104 formed on the side surface of the groove 103 is not apt to be perfectly removed because of the anisotropic etching, there are no problems. Thus, the structure that a top surface of the first silicon oxide film 102 and the block-shaped first polycrystalline silicon film 105 are covered with the photoresist but the bottom and top surfaces of the P type well region 101 are exposed is obtained.

Figure 20:
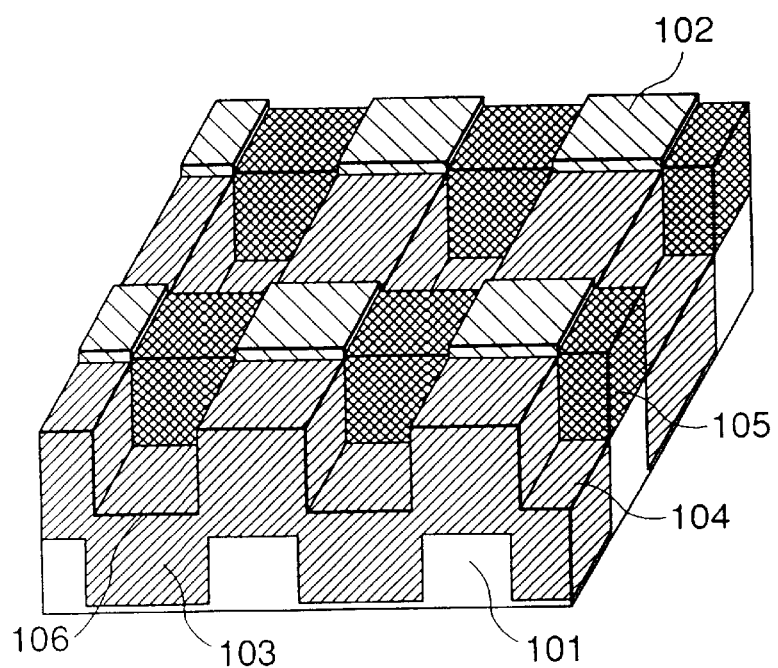

Thereafter, N type impurities, for example, arsenic are ion-implanted into the P type well region 101 between the grooves 103 (top surface) and the bottom surface and side surface of the groove 103, whereby a diffusion layer 106 is formed. After the ion implantation is performed, the photoresist covering the top surface of the first silicon oxide film 102 and the block-shaped first polycrystalline silicon film 105 is removed. Thus, the structure shown in FIG. 20 is obtained. Such ion-implantation is conducted from a slant direction to the substrate as well as a perpendicular direction thereto so that arsenic ions are implanted also into the side surface of the groove 103. Since the diffusion layer 106 should be formed deeper than the depth of the groove 103, relatively strong energy, at least stronger than first embodiment (40 KeV), for the implantation of arsenic ions are required.

Figure 21:
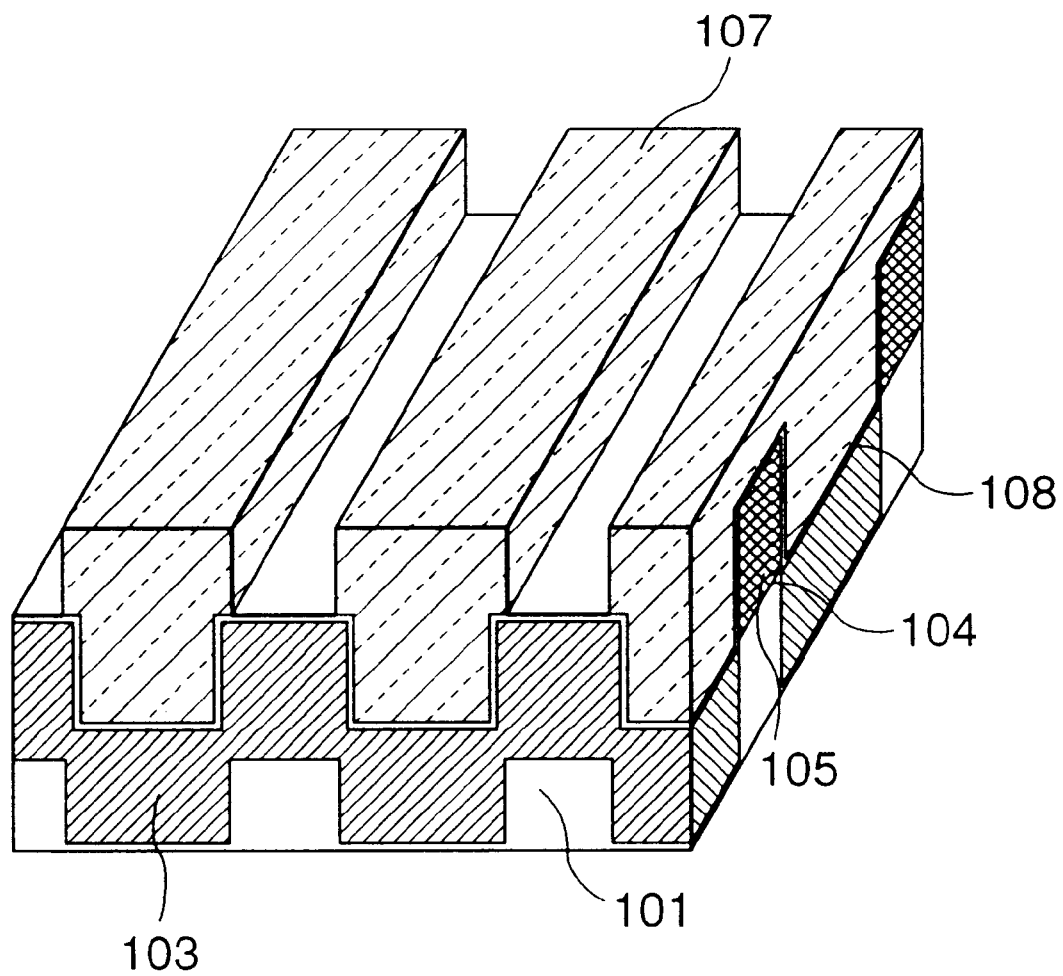

Subsequently, a third silicon oxide film 108 is formed on the top and side surfaces of the first polycrystalline silicon film 105 and the surfaces of the diffusion layer 106, by means of a thermal oxidation. Thereafter, a second polycrystalline silicon film 107 is formed so as to completely fill the groove 103. Subsequently, the second polycrystalline silicon film 107 is subjected to an anisotropic etching such as RIE along the groove 103, whereby the third silicon film 108 formed between the grooves 103 is exposed. Thus, the structure shown in FIG. 21 is obtained.

Thereafter, an interlayer insulating film is formed on the entire surface of the resultant structure. The diffusion layer 106 serving as a bit line is connected to a metal wiring (not shown) formed in parallel with the diffusion layer 106. Thus, the non-volatile semiconductor device of this embodiment of the present invention is completed.

As mentioned above, according to the second embodiment, resistance of sub bit line can be reduced and characteristics of the memory chip can be improved.

As described above, according to the present invention, the groove is formed in the semiconductor substrate, the floating gate is buried in the groove, and the control gate is formed along the groove. Therefore, the channel width of the memory cell is effectively widened than that of the conventional device, so that then ON current of the memory cell can be increased. Thus, the memory cell which operates at multi-potential stages can be easily achieved.

Furthermore, since the memory cell has the structure in which floating gate is buried in the substrate, a step difference between the cell region and the peripheral transistor region is reduced, resulting in an increase in a manufacturing margin in lithography technologies.

Furthermore, by setting the depth of the buried diffusion layer deeper than that of the groove, the resistance of the sub bit lines can be reduced, whereby the characteristics of the memory chip can be further improved.

What is claimed is:

1. A non-volatile semiconductor memory device comprising:
   a semiconductor well region of a first conductivity type having a groove, said semiconductor well region having a bottom surface which defines a bottom of said groove, a first side surface which defines one side of said groove, and a second side surface which defines the other side of said groove, said groove having first, second and third areas, each extending between said first side surface and said second side surface, said third area of said groove being interposed between said first and second areas of said groove;
   a floating gate electrode formed in said third area of said groove, said floating gate electrode having a top surface, a bottom surface, a first side surface, and a second side surface;
   a first dielectric film intervening between said bottom surface of said semiconductor well region at said third area of said groove and said bottom surface of said floating gate electrode;
   a second dielectric film intervening between said first side surface of said semiconductor well region at said third area of said groove and said first side surface of said floating gate electrode;
   a third dielectric film intervening between said second side surface of said semiconductor well region at said third area of said groove and said second side surface of said floating gate electrode;
   a fourth dielectric film formed on said top surface of said floating gate electrode;
   a first diffusion region of a second conductivity type formed in said bottom, first and second side surfaces of said semiconductor well region at said first area of said groove;
   a second diffusion region of said second conductivity type formed in said bottom, first and second side surfaces of said semiconductor well region at said second area of said groove; and
   a control gate electrode formed on said fourth dielectric film,
   each of said bottom, first and second side surfaces of said semiconductor well region at said third area of said groove being served as a channel region.

2. The non-volatile semiconductor memory device as claimed in claim 1, wherein each of said first and second side surfaces of said semiconductor well region is perpendicular to said bottom surface of said semiconductor well region.

3. The non-volatile semiconductor memory device as claimed in claim 1, wherein said groove and said control gate electrode extends to the same direction as each other.

4. The non-volatile semiconductor memory device as claimed in claim 1, further comprising a plurality of word lines, a plurality of bit lines crossing to said word lines, and a plurality of source lines arranged parallel to said bit lines, said first diffusion region being connected to an associated one of said bit lines, said second diffusion region being connected to an associated one of said source lines, said control gate electrode being connected to an associated one of said word lines.

5. The non-volatile semiconductor memory device as claimed in claim 1, wherein said groove has a first depth, said first diffusion region has a second depth, said second depth being larger than said first depth.

6. A non-volatile semiconductor memory device comprising;
   a semiconductor substrate including first and second side surfaces and a bottom surface, the surfaces together defining a groove in the semiconductor substrate;
   an array of memory cells each having a control gate, a floating gate, a drain region, a source region, and a channel region interposed between said drain and source regions the source region, channel region and drain region each comprising the first and second side surfaces and the bottom surface of the groove;
   a plurality of word lines, each extending in a first direction across the array of memory cells and comprising control gates of said memory cells;
   a plurality of bit lines, each extending in a second direction across the array of memory cells and comprising drain regions of said memory cells; and
   a plurality of source lines, each extending in the second direction across the array of memory cells and comprising source regions of the memory cells.

7. The non-volatile semiconductor memory device as claimed in claim 6, wherein said floating gate is interposed between said first and second side surfaces of the groove.

8. A non-volatile semiconductor memory device comprising:
   a semiconductor substrate defining a groove;

first and second diffusion regions formed in surfaces defining the groove and extending between opposing edges of the groove;

a floating gate electrode filling the groove between the first and second diffusion regions; and a control gate electrode formed on the floating gate electrode and separated from the floating gate electrode by an insulating film.

* * * * *

UNITED STATES PATENT AND TRADEMARK OFFICE
CERTIFICATE OF CORRECTION

PATENT NO. : 6,060,739
DATED : May 9, 2000
INVENTOR(S) : Keniji SAITOH.

It is certified that error appears in the above-identified patent and that said Letters Patent is hereby corrected as shown below:

On the title page, insert:

--[30]   Foreign Application Priority Data

- -December 20, 1996   Japan......................... 341454/1996- -.

Signed and Sealed this

Twenty-second Day of May, 2001

Attest:

NICHOLAS P. GODICI

*Attesting Officer*   Acting Director of the United States Patent and Trademark Office